(12) United States Patent
Jahnes et al.

(10) Patent No.: US 8,940,570 B2
(45) Date of Patent: Jan. 27, 2015

(54) MICRO-ELECTRO-MECHANICAL SYSTEM (MEMS) STRUCTURES AND DESIGN STRUCTURES

(75) Inventors: Christopher V. Jahnes, Upper Saddle River, NJ (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 13/342,450

(22) Filed: Jan. 3, 2012

(65) Prior Publication Data
US 2013/0168782 A1 Jul. 4, 2013

(51) Int. Cl.
*H01L 21/00* (2006.01)

(52) U.S. Cl.
USPC ........ 438/52; 438/50; 257/415; 257/E21.002; 257/E29.324; 716/100

(58) Field of Classification Search
USPC ........ 257/415, E21.002, E29.324; 438/50, 52
See application file for complete search history.

(56) References Cited

U.S. PATENT DOCUMENTS

| | | | |
|---|---|---|---|
| 5,679,436 A | 10/1997 | Zhao | |
| 5,959,516 A | 9/1999 | Chang et al. | |
| 6,377,438 B1 | 4/2002 | Deane et al. | |
| 6,621,392 B1 | 9/2003 | Volant et al. | |
| 6,635,919 B1 | 10/2003 | Melendez et al. | |
| 6,661,069 B1 | 12/2003 | Chinthakindi et al. | |
| 6,876,283 B1 | 4/2005 | Weber et al. | |
| 6,906,905 B1 | 6/2005 | Chinthakindi | |
| 7,085,122 B2 | 8/2006 | Wu et al. | |
| 7,141,989 B1 | 11/2006 | Liu | |
| 7,155,182 B2 | 12/2006 | Eckl et al. | |
| 7,265,019 B2 | 9/2007 | Chinthakindi et al. | |
| 7,319,580 B2 | 1/2008 | Chou | |
| 7,345,866 B1 | 3/2008 | Hsu et al. | |
| 2002/0079743 A1 | 6/2002 | Ma et al. | |
| 2002/0171326 A1 | 11/2002 | Hartwell | |
| 2003/0099082 A1 | 5/2003 | Tuo et al. | |
| 2010/0155203 A1* | 6/2010 | Wang et al. | 200/181 |
| 2010/0258885 A1 | 10/2010 | Wang et al. | |

FOREIGN PATENT DOCUMENTS

| | | |
|---|---|---|
| DE | 10031569 A1 | 2/2001 |
| JP | 10149951 | 2/1998 |
| WO | 2006046193 A1 | 5/2006 |

OTHER PUBLICATIONS

Examination Report for related Application No. GB1300017.9 dated Dec. 5, 2013, 3 pages.
Communication for related Application No. 102012223968.5 dated Jun. 17, 2014, 8 pages.
Response to Examination Report for related Application No. GB1300017.9 dated Jan. 31, 2014, 26 pages.
Response to Examination Report for related Application No. GB1300017.9 dated Mar. 19, 2014, 3 pages.

* cited by examiner

*Primary Examiner* — Elias M Ullah
(74) *Attorney, Agent, or Firm* — Anthony Canale; Roberts Mlotkowski Safran & Cole, P.C.

(57) ABSTRACT

Micro-Electro-Mechanical System (MEMS) structures, methods of manufacture and design structures are disclosed. The method includes forming at least one fixed electrode on a substrate. The method further includes forming a Micro-Electro-Mechanical System (MEMS) beam with a varying width dimension, as viewed from a top of the MEMS beam, over the at least one fixed electrode.

21 Claims, 9 Drawing Sheets

US 8,940,570 B2

MICRO-ELECTRO-MECHANICAL SYSTEM (MEMS) STRUCTURES AND DESIGN STRUCTURES

FIELD OF THE INVENTION

The invention relates to semiconductor structures and methods of manufacture and, more particularly, to Micro-Electro-Mechanical System (MEMS) structures, methods of manufacture and design structures.

BACKGROUND

Varactors are devices whose capacitance varies with applied voltage. Varactors are typically made using MOS capacitors whose depletion region varies with applied voltage, resulting in roughly 3:1 variation in capacitance. Silicon varactors (e.g., solid-state varactors) have poor isolation from the silicon substrate and also are limited in their tuning range.

Typically, solid-state varactors are employed where tunable capacitance is required. However, solid-state varactors provide a very limited tuning range and have a high resistive loss and relatively high power consumption. For example, in a solid state varactor diode, the varactor's capacitance is set by a bias current generated by a sub-circuit that consumes a significant amount of steady state power. Also, the signal current applied to a solid-state varactor may tend to affect the capacitance, thus inducing some measure of error.

To avoid these problems, a MEMS varactor may be used in the place of solid-state varactors. However, known MEMS varactors suffer from a small tuning range (<3:1) due to the "snap down" effect. This effect causes the gap between two plates of the varactor to close abruptly as the electrostatic attraction force provided by a pair of actuation electrodes exceeds the spring restoring force of the MEMS beam. Once spacing is decreased by more than one third, the snap down phenomenon takes effect and the formerly free end of the MEMS beam makes contact with the base of the device. Because of the snap down effect, MEMS varactors have often been employed as bi-stable devices, rather than as true varactors continuously tunable over a full range of capacitances.

Accordingly, there exists a need in the art to overcome the deficiencies and limitations described hereinabove.

SUMMARY

In a first aspect of the invention, a method comprises forming at least one fixed electrode on a substrate. The method further comprises forming a Micro-Electro-Mechanical System (MEMS) beam with a varying width dimension, as viewed from a top of the MEMS beam, over the at least one fixed electrode.

In another aspect of the invention, a method of forming a MEMS varactor comprises forming a fixed electrode layer on a substrate through deposition and patterning. The method further comprises forming a sacrificial material over the fixed electrode. The method further comprises layering metal and insulator materials over the sacrificial material. The method further comprises masking the layered metal and insulator materials with a varying width dimension. The method further comprises etching the layered metal and insulator materials to form a beam structure with a non-uniformed width dimension. The non-uniform width dimension includes a reduced area portion of an initial pull-in section of the beam. The method further comprises forming a cavity about the beam through a venting process.

In yet another aspect of the invention, a structure comprises fixed electrodes formed on a substrate. The structure further comprises a composite beam structure having a varying width dimension with at least a first portion of a constant dimension and a second portion of a reduced width compared to the first portion, the second portion comprising an initial pull-in portion of the beam structure. The structure further comprises a cavity structure surrounding the beam structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the Micro-Electro-Mechanical System (MEMS) structures, which comprises the structures of the present invention. In still further embodiments, a method in a computer-aided design system is provided for generating a functional design model of the Micro-Electro-Mechanical System (MEMS) structures. The method comprises generating a functional representation of the structural elements of the Micro-Electro-Mechanical System (MEMS) structures.

More specifically, in embodiments of the present invention, a method in a computer-aided design system for generating a functional design model of a MEMS structure is provided. The method comprises generating a functional representation of a fixed electrodes formed on a substrate; generating a functional representation of a composite beam structure having a varying width dimension with at least a first portion of a constant dimension and a second portion of a reduced width compared to the first portion, the second portion comprising an initial pull-in portion of the beam structure; and generating a functional representation of a cavity structure surrounding the beam structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to Micro-Electro-Mechanical System (MEMS) structures, methods of manufacture and design structures. More specifically, in embodiments, the present invention relates to tunable MEMS varactors with a linear response to applied voltage, and respective processing steps of forming the MEMS varactors. It should be understood by those of ordinary skill in the art that the present invention is not limited to MEMS varactors, and that the methods and structures of the present invention could apply to any MEMS rf devices or other devices such as MEMS contact switches, bulk acoustic wave resonators, etc.

Advantageously, the present invention can be used as varactors whose capacitance varies with applied voltage. More specifically, the present invention provides an improved linear tuning range of at least 3.5:1 and can exceed, in embodiments, a tuning range of 10.5:1. The MEMS varactors of the present invention also exhibit low leakage current, and can be activated with low currents on the order of micoamps, compared to solid state varactors which require nanoamps. The MEMS varactors of the present invention also exhibit improved isolation from the silicon substrate. The MEMS varactors of the present invention can be cantilever beams or bridge beams, depending on the specific design criteria of the structure.

In embodiments, the MEMS varactors comprise a tapered or reduced beam structure, i.e., reduced area, which reduces initial capacitance during pull-in of the MEMS beam. More specifically, in a cantilever beam structure, the end of the beam can be tapered. The tapering can be, for example, a gradual taper and/or a stepped tapered, as discussed herein. In further embodiments, a bridge beam is contemplated by the present invention, with a reduced area at the initial pull-in location, e.g., mid section. In still further embodiments, the present invention contemplates the use of bumpers to reduce initial capacitance during pull-in of the MEMS beam. These bumpers can be, for example, of constant or variable height, e.g., taller at an end of the cantilever beam or mid section of a bridge beam, and may comprise insulator material; although other materials are also contemplated herein. In yet further embodiments, the present invention also contemplates other schemes in which the initial capacitance is reduced, as well as providing improved pull-in control during stages of actuation, e.g., to control pull-in as the beam becomes closer to the fixed electrode, as discussed below.

Figure 1:
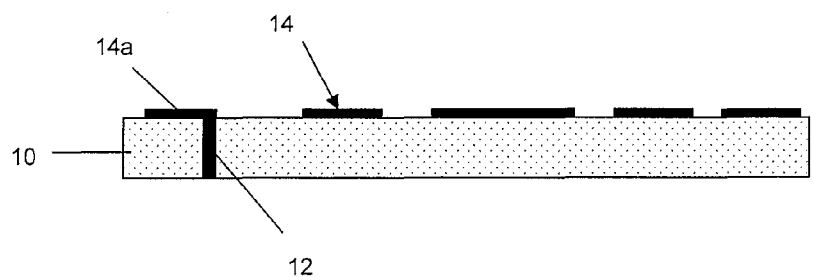
FIGS. 1-7 show structures and respective processing steps in accordance with aspects of the present invention.

FIG. 1 shows a structure and related processing steps in accordance with aspects of the invention. The structure includes, for example, a substrate 10. The substrate 10, in embodiments, can be any layer of a device. In embodiments, the substrate 10 is an oxide or other insulator material known to those of skill in the art. As should be known to those of skill in the art, the substrate 10 can be implemented in either an SOI wafer or BULK implementation, or could be an insulating substrate such as sapphire or silica glass. The constituent materials of the SOI wafer or BULK implementation may be selected based on the desired end use application of the semiconductor device. For example, the insulation layer, e.g., BOX, may be composed of oxide, such as $SiO_2$. Moreover, the active semiconductor layer can be comprised of various semiconductor materials, such as, for example, Si, SiGe, SiC, SiGeC, etc. The SOI wafer may be fabricated using techniques well known to those skilled in the art. For example, the SOI wafer may be formed by conventional processes including, but not limited to, oxygen implantation (e.g., SIMOX), wafer bonding, etc.

An interconnect 12 is provided within the substrate 10. The interconnect 12 can be, for example, a tungsten or copper stud formed in a conventionally formed via. For example, the interconnect 12 can be formed using any conventional lithographic, etching and deposition processes, known to those of skill in the art for forming studs.

Still referring to FIG. 1, a wiring layer is formed on the substrate 10 to form multiple wires 14 using conventional deposition and patterning processes. For example, a wiring layer can be deposited on the substrate to a depth of about 0.25 microns; although other dimensions are contemplated by the present invention. Thereafter, the wiring layer is patterned to form the wires 14. At least one of the wires 14a is in contact (direct electrical contact) with the interconnect 12. In embodiments, the wires 14 can be formed from aluminum; although other wiring materials are also contemplated by the present invention. For example, the wires 14 can be a refractory metal such as Ti, TiN, TaN, Ta, and W, or AlCu, AlCuSi, amongst other wiring materials.

Figure 2:
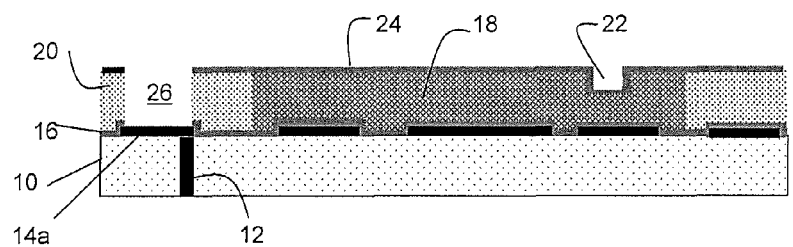

In FIG. 2, an optional insulator material 16 is formed on the multiple wires 14 and exposed portions of the substrate 10. In embodiments, the insulator material 16 is an oxide deposited to about 50 nm; although other dimensions are also contemplated by the present invention. A sacrificial material 18 can be deposited on the insulator material 16 using a conventional plasma vapor deposition (PVD), plasma enhanced chemical vapor deposition (PECVD), or any known process. In embodiments, the sacrificial material 18 is deposited to a height of about 2 microns (2 μm), and is patterned using conventional lithographic and reactive ion etching (RIE) steps. As optional processing steps, the sacrificial material 18 can be polished using, for example, a chemical mechanical polishing (CMP) and then additional sacrificial material (silicon) can be deposited on the polished sacrificial material 18.

In more specific embodiments, the sacrificial material 18 can be, for example, silicon, tungsten, tantalum, germanium, or any material which can subsequently be selectively removed using, for example $XeF_2$ gas, to the insulator material 16 or the wires 14 (if the insulator material 16 is absent). Alternatively, any sacrificial material, such as a spin-on polymer, could be used by the present invention. The sacrificial material 18 can be deposited using any conventional plasma vapor deposition (PVD), PECVD, rapid thermal CVD (RTCVD), or LPCVD which operates at temperatures compatible with the wires 14, e.g., <420° C. In embodiments, the sacrificial material 18 is deposited to a height of about 0.1 to 10 μm which is determined by the MEMS gap requirement, and is patterned using conventional lithographic and reactive ion etching (RIE) steps.

Referring still to FIG. 2, an insulator material (e.g., oxide) 20 is deposited on the sacrificial material 18. The deposition can be, for example, a conventional conformal deposition process, e.g., chemical vapor deposition (CVD), depositing the insulator material 20 to a depth of about 2.3 μm to about 3.3 μm. The insulator material 20 can be polished, e.g., planarized using a CMP process, to achieve a planar surface with the sacrificial material 18.

In embodiments, the insulator material 20 can undergo a reverse etch (reverse damascene process). More specifically, a resist can be deposited on the insulator material 20, which is patterned to form an opening, with the resist edges overlapping with edges of the underlying sacrificial material 18. That is, the resist will slightly mask the underlying sacrificial material 18, resulting in a reverse image of the patterned sacrificial material 18. The insulator material 20 is then planarized, e.g., to be planar (e.g., flat or planar surface) with the underlying sacrificial material 18. That is, in embodiments, the insulator material 20 can be etched to the underlying sacrificial material 18. This planarization process will also planarize the underlying sacrificial material 18. The planarization process can be, for example, a CMP process.

Still referring to FIG. 2, in an optional embodiment, one or more trenches 22 can be formed in the sacrificial material 18, over wirings 14. In embodiments, the trenches 22 can be of constant or varying depths used to form an array of bumpers for the MEMS beam. In embodiments, the trenches 22 can be an array of trenches, i.e., to form actuator bumps, sized and shaped according to the location on the MEMS beam, e.g., the depth of the trenches may increase towards an end of a MEMS cantilever beam or, alternatively, a reduced area of the beam structure which is initially pulled-in during actuation (whether a cantilever beam or a bridge beam). In embodiments, the array of trenches are structured so as to provide a pre-determined amount of physical spacing between the MEMS beam and an actuator electrode when a voltage is present on the actuator electrode; or they are positioned so that the grounded and dc biased actuators never come into physical contact. The array of bumpers (formed by the trenches) can also prevent MEMS beam stiction.

In embodiments, deeper trenches can be formed at an end or mid section (e.g., initial pull-in of the MEMS beam), and can be e.g., formed to a depth of about 0.3 μm; although other dimensions are contemplated by the invention depending on the design parameters and, more particularly, the height of the sacrificial material 18. For example, the depth can range from about 1000 Å to 500 Å. A capacitor oxide deposition is performed on the exposed surfaces, e.g., on the sacrificial material 18, insulator material 20 and in the trench 22, to form a liner 24. A via 26 can be formed in the insulator material 20 to the underlying wire 14a, using conventional lithographic and etching processes.

Figure 3:
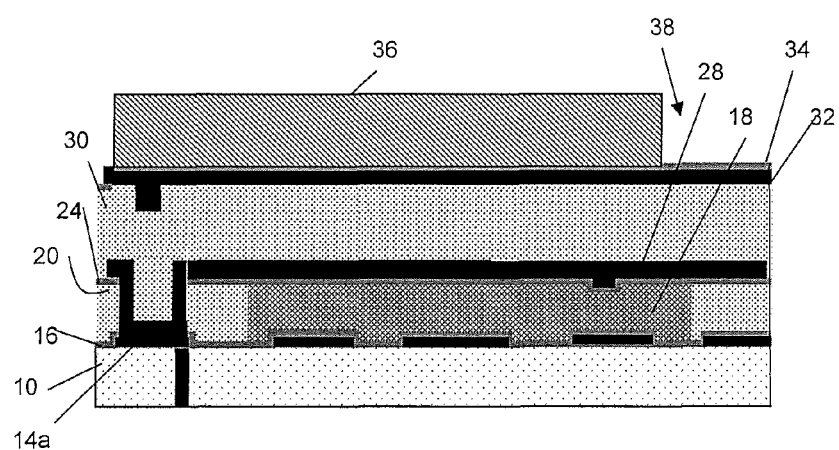

As shown in FIG. 3, an electrode 28 is formed over the insulator material 24, and also deposited within via 26 to contact the underlying wire 14a. The electrode 28 can also be deposited in the one or more trenches 22 (e.g., when the bumpers are formed of metal). In embodiments, the electrode 28 can be, for example, AlCu or AlCuSi; although other materials are also contemplated by the invention. In embodiments, for example, the electrode 28 can be a TiN, TaN, Ta or W, amongst other materials. The thicknesses of this and other electrodes and/or wires can vary depending on the specific design parameters. The electrode 28 can be patterned at this stage or later. An insulator material 30 is formed on the electrode 28. In embodiments, the insulator material 30 is conformally deposited over the electrode 28. In embodiments, the insulator material 30 is a PECVD TEOS (oxide) that is deposited to a height of about 2 μm; although other dimensions are also contemplated by the present invention.

Still referring to FIG. 3, an upper electrode 32 is formed over the insulator material 30. In embodiments, the upper electrode 32 can be, for example, AlCu; although other materials are contemplated by the invention. In embodiments, for example, the upper electrode 32 can be TiN, TaN, Ta, or W, amongst other materials, and should be a thickness which balances the overall volume of the device, and hence not place undue stresses on the beam of the MEMS structures. In other words, the thickness of the electrode 32 should be the same or substantially the same as the thickness of the electrode 28. An insulator material (capacitor oxide) 34 is deposited on the electrode 32. In embodiments, an optional insulator material 34 is deposited to a height of about 80 nm; although other dimensions are also contemplated by the present invention.

A resist (e.g., mask layer) 36 is formed on the insulator material 34. In embodiments, the resist 36 is patterned to form one or more opening 38. The opening 38 is formed by conventional lithographic and etching processes, as is known to those of skill in the art. In embodiments, the opening 38 will overlap with the underlying sacrificial material 18.

Figure 4:
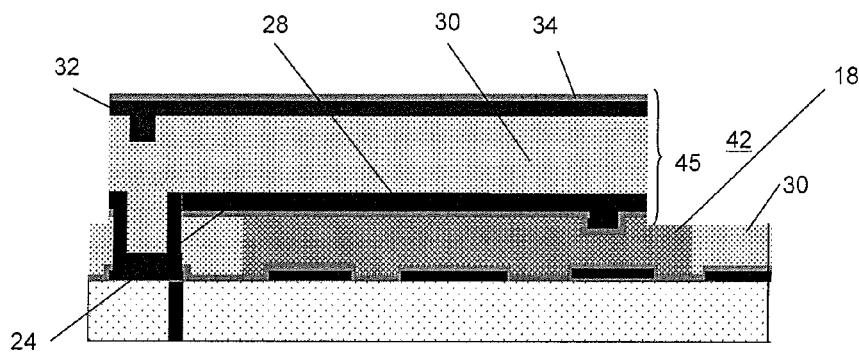

In FIG. 4, a beam structure (suspended electrode) 45 is formed by removing portions of the following materials: insulator material 34, electrode 32, insulator material 30, electrode 28, insulator material 24 and insulator material 20. More specifically, portions of layers 34, 32, 30, 28, 24 and 20 are removed using the mask layer 36. In this way, the beam structure (suspended electrode) 45 comprising the electrode 32, insulator material 30, and electrode 28 (and, in embodiments, insulator materials 24 and 30) can be formed.

It should be understood by those of ordinary skill in the art that the constituent materials of the beam structure (suspended electrode) 45 can vary depending on the application of the MEMS structure. For example, in embodiments, the beam structure (suspended electrode) 45 can be a metal beam. In other embodiments, the beam structure (suspended electrode) 45 can be an oxide and metal beam (with the oxide underneath the beam). In still other embodiments, the beam structure (suspended electrode) 45 can be an oxide, metal, oxide beam. In any of these embodiments, the beam structure (suspended electrode) 45 can be formed with insulating (actuator) bumps of constant or varying heights, all of which are formed using conventional lithographic, etching and deposition processes, known to those of skill in the art.

In further embodiments, the beam structure (suspended electrode) 45 can be formed with multiple masks or a single mask. That is, with a single mask, all of the layers of the beam structure (suspended electrode) 45 can be patterned in a single etching process; whereas, in contemplated embodiments, the beam structure (suspended electrode) 45 can be patterned in multiple etching steps, depending on the particular designs of the beam structure (suspended electrode) 45.

In the patterning step, the beam structure (suspended electrode) 45 can be formed as a tapered shape or with other reduced cross sectional (width) area of many different configurations. These different configurations can be provided for both a cantilever beam structure and a beam structure as shown, for example, in FIGS. 8a, 8b, 8c, 9a, 9b, and 9c. It should be understood by those of ordinary skill in the art that other tapered or reduced area shapes are also contemplated by the present invention, as discussed with reference to FIGS. 8a, 8b, 8c, 9a, 9b, and 9c. These different shapes are formed by the shape of the mask, during the formation of the beam structure 45, using conventional RIE processes, for example.

Figure 5:
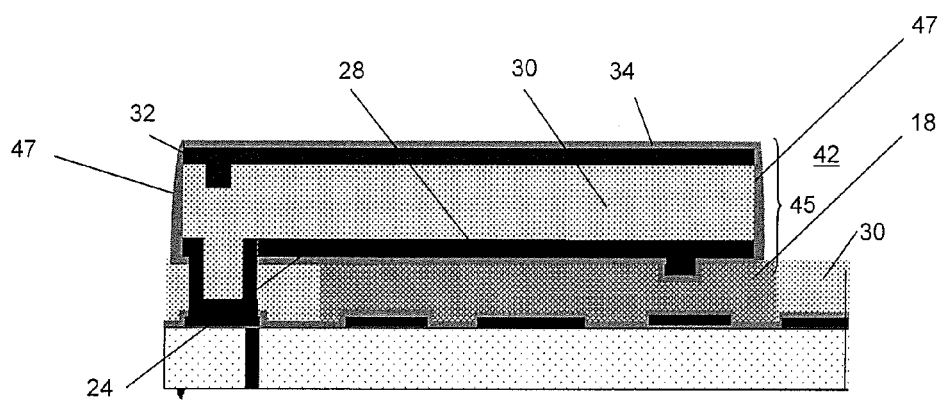

In FIG. 5, an optional insulator spacer 47 is formed on the sidewall of the exposed beam structure 45. An insulator spacer 47 could be formed by depositing 100 nm of PECVD $SiO_2$ oxide followed by a directional etch back to remove the oxide from flat surfaces while leaving it on vertical surfaces, as known in the art. The purpose of the oxide spacer 47 is to protect the metal layers 28 and 32 from reacting with subsequent sacrificial layer 44 (see, FIG. 6) during deposition processes. Note that the optional spacer etchback would etch some or all of insulator layer 34, so the deposited thickness of insulator layer 34 would need to be adjusted so that its final thickness was at the target value.

Figure 6:
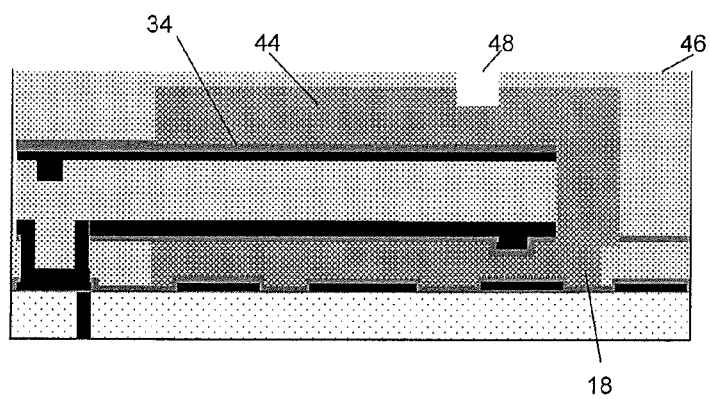

In FIG. 6, a sacrificial material 44 is deposited on the structure. More specifically, the sacrificial material 44 such as, for example, silicon or other materials as already discussed herein, is deposited on the insulator material 32 and within via 42. The sacrificial material 44 can be deposited using a conventional conformal process, e.g., PVD or PECVD process, as discussed above. In embodiments, the sacrificial material 44 is deposited in contact with exposed portions of the sacrificial material 18, and is deposited to a height of about 4 microns (4 μm), and is patterned using conventional lithographic and RIE steps. As optional processing steps, the sacrificial material 44 can be polished using, for example, a chemical mechanical polishing (CMP) and then additional sacrificial material (silicon) can be deposited on the polished sacrificial material 44. In embodiments, due to Hf acid cleaning, there will be no oxide between the two layers of sacrificial material (e.g., layer 18 and layer 44).

As further shown in FIG. 6, after patterning of the sacrificial material 44, an insulator layer 46, e.g., oxide material, is deposited on the sacrificial material 44 (and other exposed layers). The deposition process can be, for example, a conventional conformal deposition process, depositing the insulator layer 46 to a depth of about 2.3 μm to about 3.3 μm. The insulator layer 46 can then undergo a CMP process and/or reverse etch (reverse damascene process) as discussed above. In embodiments, a vent hole 48 is opened in the insulator layer 46, exposing a portion of the underlying sacrificial material 44. It should be understood that more than one vent hole 48 can be formed at several locations, to expose portions of the upper sacrificial material 44 and the lower sacrificial material 18 or both materials 18 and 44, using conventional lithographic and etching processes known to those of skill in the art. In embodiments, the structure, and in particular, the exposed sacrificial material 44, can be cleaned with an HF solution.

Figure 7:
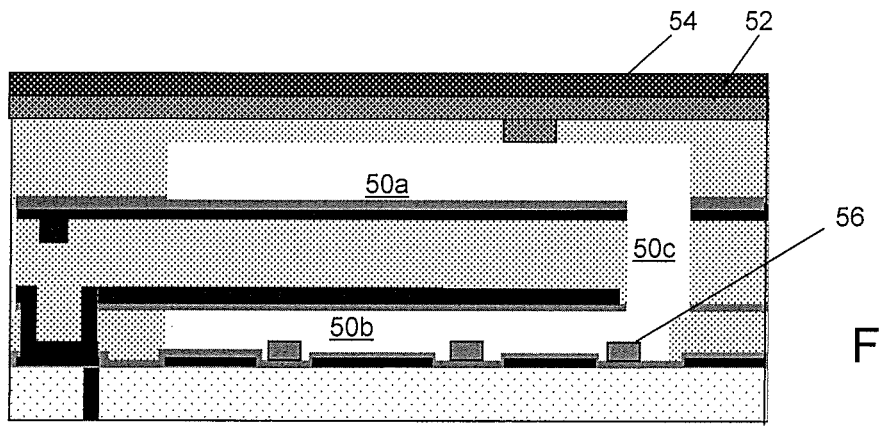

In FIG. 7, the sacrificial materials 18 and 44 are stripped or vented by way of the vent hole 48. In embodiments, the stripping (e.g., etching) can be performed using a $XeF_2$ etchant through the vent hole 48. The etching will strip all of the sacrificial material (e.g., silicon), forming an upper cavity 50a, a lower cavity 50b and a connecting via 50c. The vent hole 48 can be sealed with a dielectric or conductive material 52. For example, in embodiments, a PECVD process can form a layer of about 1.0 μm. A second deposition process, e.g., SACVD, can be performed to form a layer of about 0.7 μm. In further embodiments, a nitride cap 54 is deposited on the dielectric material 52. In embodiments, the nitride cap 54 can be about 0.5 μm.

It should be understood by those of skill in the art that more than one MEMS beam 45 may be fabricated using the processes of the present invention. For example, in embodiments, two or more MEMS beams can be fabricated in separate cavities using the processes of the present invention. Specifically, two MEMS beams can be formed one on top of another (whose cavities are separated by an insulator material) using the processes of the present invention. That is, a MEMS beam can be fabricated above the last insulator material 46, prior to the deposition of materials 52 and 54. In embodiments, the additional MEMS beam can be formed using the sacrificial materials, as noted above, with a vent hole being used to remove all of the sacrificial material for all of the MEMS beam. In embodiments, though, the sacrificial materials for each of the MEMS beams can be removed in separate etching processes, using the fabrication steps described herein.

FIG. 7 also shows an optional bumper 56 extending above one or more of the fixed actuators 14. In embodiments, the optional bumper 56 can extend from between the fixed actuators 14. The optional bumpers 56 can be, for example, oxide bumpers formed using conventional deposition and etching processes. For example, the bumpers can be formed by any conventional deposition, e.g., CVD, of oxide or other insulator material, and thereafter a conventional etching or patterning process. It should be understood by those of skill in the art that the optional bumpers 56 can be formed of the same height or of varying heights, similar to that discussed with regard to the actuator bumps. Also, these optional bumpers can be used in combination with the actuator bumps, or without the use of the actuator bumps. Moreover, the optional bumpers 56 can be used with either a cantilever beam or a bridge beam structure.

FIGS. 8a, 8b, 8c, 9a, 9b, and 9c show various shaped MEMS beam structures in accordance with aspects of the present invention. It should be understood by those of ordinary skill in the art that FIGS. 8a, 8b, 8c, 9a, 9b, and 9c can be representative of either a top view of a cantilever beam structure or a partial top view of a bridge beam structure. For example, in the cantilever beam structure, the reduced area portion is suspended; whereas, in the bridge beam structure, the reduced area portion would be representative of a mid section of the beam, with the remaining beam being a mirror image of the structure already shown. (See, as one example, FIG. 10.)

In each of these embodiments, the MEMS beam 45 has a length "X" of about 220 μm; although other dimensions are also contemplated by the present invention. Moreover, each of the MEMS beams 45 include a uniform width area (e.g., non-reduced area) 100. In embodiments, the width "Y" of the uniform width area 100 may be, for example, 40 μm; although other width dimensions are also contemplated by the present invention. For example, the uniform width area 100 may be for example, 20 μm on opposing ends of the bridge beam configuration. Moreover, each of the MEMS beams 45 have a reduced cross section area, as described below.

Figure 8A:
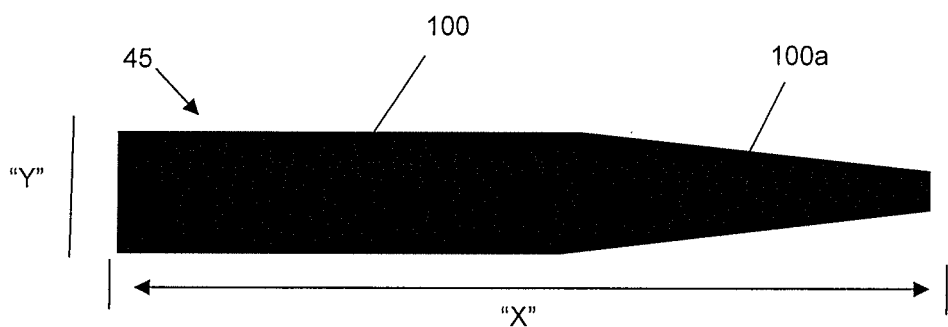
FIGS. 8a, 8b, 8c, 9a, 9b, and 9c show various shaped MEMS beams in accordance with aspects of the present invention.

In FIG. 8a, the MEMS beam 45 has the uniform width area (e.g., non-reduced area) 100 which transitions into a tapered end 100a (or mid section for a bridge beam configuration). In embodiments, the tapered end 100a is a reduced area portion, which includes a non-uniform width that begins its taper along a length portion of the MEMS beam 45. In embodiments, the taper has a width ranging from less than the width of the non-reduced area 100 to about 1 μm to 50 μm, for example. Of course, other dimensions are also contemplated by the present invention.

Figure 8B:
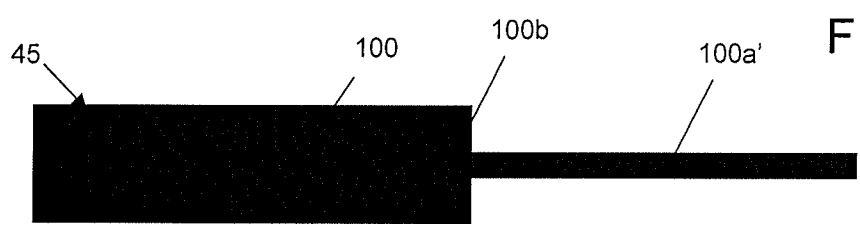

In FIG. 8b, the MEMS beam 45 has a uniform width area (e.g., non-reduced area) 100 which transitions into a narrowed end 100a' (having a constant width). In embodiments, a step or shoulder 100b is provided between the narrowed end 100a' and the uniform width area (e.g., non-reduced area) 100. The step or shoulder 100b can start at any distance along the length of the MEMS beam 45. In embodiments, the narrowed end (i.e., reduced area) 100a' can have any width from less than the width of the non-reduced area 100, e.g., 1 μm to 50 μm, and can have a length of about 300 μm. Of course, other dimensions are also contemplated by the present invention. As should be understood by those of skill in the art, in the bridge beam configuration, the narrowed end 100a' will be the mid section of the MEMS bridge beam structure.

Figure 8C:
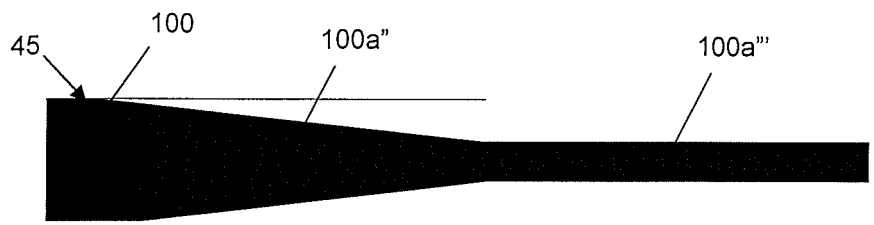

FIG. 8c shows a MEMS beam 45 which includes a reduced area portion, comprising both a tapered portion and a narrow end portion of uniform width. More specifically, in FIG. 8c, the MEMS beam 45 has the uniform width area (e.g., non-reduced area) 100 which transitions into a tapered portion 100a". This tapered portion 100a" can start its taper along a length portion of the MEMS beam 45 and, more preferably at about 300 μm (from the narrow end portion). In embodiments, the tapered portion 100a" can have a width ranging from less than the width of the uniform width area (e.g., non-reduced area) 100 to about 1 µm to 50 µm, for example. Of course, other dimensions are also contemplated by the present invention.

Still referring to FIG. 8c, the tapered portion 100a" transitions into a narrowed end 100a''' (of constant width). The narrowed end 100a''' can have a uniform width (cross section), which may be any width less than the width of the uniform width area (e.g., non-reduced area) 100, e.g., 1 µm to 50 µm. Also, the narrowed end 100a''' can have a length of about 300 µm. Of course, other dimensions are also contemplated by the present invention. As should be understood by those of skill in the art, in the bridge beam configuration, the tapered portion 100a" and the narrowed end 100a''' will be the mid section of the MEMS bridge beam structure (e.g., see FIG. 10).

Figure 9A:
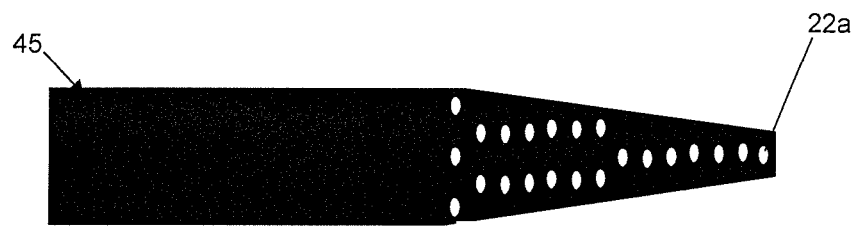
Figure 9B:
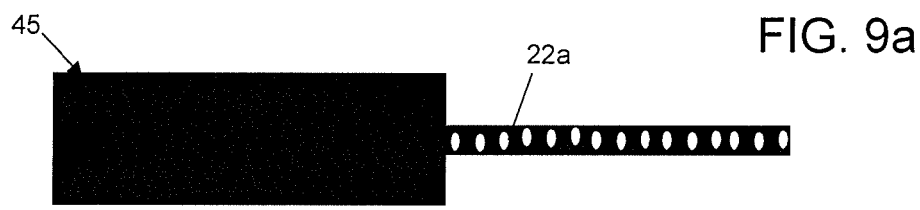
Figure 9C:
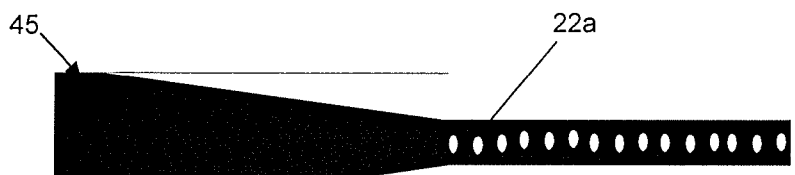

The MEMS beams 45 of FIGS. 9a, 9b, and 9c have the same shape as the MEMS beams 45 of FIGS. 8a, 8b, and 8c, respectively; however, in these embodiments, an array of bumpers 22a extend from a surface of the MEMS beam 45. In embodiments, the array of bumpers 22a can have a constant or varying height, depending on the location of the bumpers 22a on the MEMS beam 45 and/or the narrowest portion of the tapered portion 100a". For example, as discussed above, the bumpers 22a can have a greater height towards the initial pulled-in area of the MEMS beam during actuation. For example, in a cantilever beam configuration, the bumpers 22a can have a greater height at the end of the beam; whereas, in the bridge beam confirmation, the bumpers 22a can have a greater height around the mid section of the beam.

In embodiments, the height of the bumpers 22a can be constant or can have various heights ranging from about 5000 Å to 50 Å, depending on the initial space between the MEMS beam 45 and the fixed electrodes (wires 14), i.e., gap formed by the sacrificial material 18. Of course, other dimensions are also contemplated by the present invention. For example, in one embodiment, the bumpers 22a may have a height of 1000 Å at an end of the beam. In embodiments, the bumpers 22a are oxide bumpers which are formed in the trenches (22) shown initially in FIG. 2; although other insulator materials are also contemplated by the present invention, depending on the desired capacitance. For example, the bumpers 22a can be a high-k dielectric, e.g., $HfO_2$, which will increase the capacitance value of the device.

Figure 10:
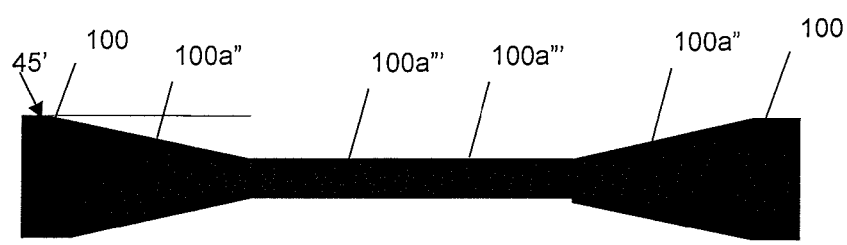
FIG. 10 shows a top view of a MEMS bridge beam in accordance with aspects of the present invention.

FIG. 10 shows a top view of a MEMS bridge beam in accordance with aspects of the present invention. More specifically, FIG. 10 is representative of the MEMS beam of FIG. 8c, for example. As shown in this representation, the reduced area, e.g., width area 100''', is provided in a mid section of the beam, with the tapered portion 100a" extending from opposing sides thereof. Thus, as should now be more clearly understood by those of ordinary skill in the art, each of the configurations shown in FIGS. 8a, 8b and 8c can be provided as bridge beams (with or without actuator bumpers).

Figure 11:
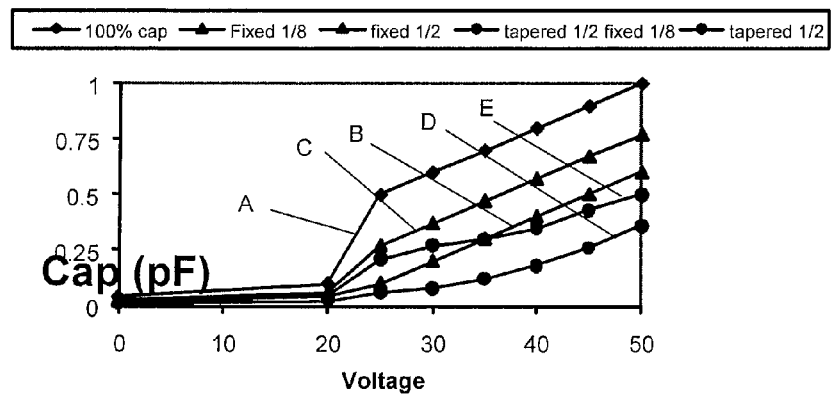
FIG. 11 shows a comparison graph of "snap down" effect of various MEMS beam designs of the present invention vs. a conventional MEMS beam.

FIG. 11 shows a comparison graph of "snap down" effect of various MEMS beam designs of the present invention vs. a conventional, non-reduced area MEMS beam. In FIG. 11, the x-axis is voltage and the "y" axis is capacitance (measured in pF). As shown in this graph, line "A" represents a conventional, non-reduced area MEMS beam; whereas, lines "B"-"E" represent MEMS beams of the present invention, e.g., MEMS beam with reduced areas. For example, line "B" represents a MEMS beam having a tapered end that begins at approximately ⅛ of the length of the beam (e.g., a MEMS beam design of FIG. 8a);

line "C" represents a MEMS beam having a reduced area that is approximately ½ of the length of the beam (e.g., a MEMS beam design of FIG. 8b);

line "D" represents a MEMS beam having a tapered end that begins approximately at ½ of the length of the beam with a further reduced area at ⅛ from the end of the beam (e.g., a MEMS beam design of FIG. 8c); and line "E" represents a MEMS beam having a tapered end that is approximately ½ of the length of the beam (e.g., a MEMS beam design of FIG. 8a).

As shown in the graph of FIG. 11, the conventional MEMS beam does not have a linear pull-in, upon the application of voltage. Instead, the conventional MEMS beam suffers from a snap down effect at about 20V. The conventional MEMS beam also has the highest capacitance, due to the increased overall surface area, compared to the MEMS beams represented in lines "B"-"E". In contrast, the MEMS beams of the present invention represented by lines "B"-"E" show a linear response to voltage, starting at about 20V. This linear response is attributed to the reduced area portions of the MEMS beams, as described above.

Table 1 shows an actuated tuning range of the conventional MEMS beam (with a uniform cross section (no reduced area)) and that of the MEMS beams configurations of the present invention. Tuning ranges can be defined, for example, as the relative ration of initial contact to complete contact of the MEMS beam to the lower electrode, at high voltage, e.g., 50V.

As seen from Table 1, the actuated tuning range of the conventional MEMS beam is 2.0. This is well below the preferred tuning range of 3:1, which is achievable with a solid state structure. In contrast, each of the actuated tuning ranges of the MEMS beams of the present invention are higher than the conventional MEMS beam. In fact, tuning ranges of up to 6:1 are achievable by the present invention. This tuning range is more than double that of conventional solid state varactors and three times that of a conventional MEMS beam.

TABLE 1

| LAYOUT | ACTUATED TUNING RANGE |
|---|---|
| Conventional MEMS beam | 2.0 |
| MEMS beam represented at line "B" of FIG. 11 | 6.0 |
| MEMS beam represented at line "C" of FIG. 11 | 2.9 |
| MEMS beam represented at line "D" of FIG. 11 | 6.0 |
| MEMS beam represented at line "E" of FIG. 11 | 2.4 |

Figure 12:
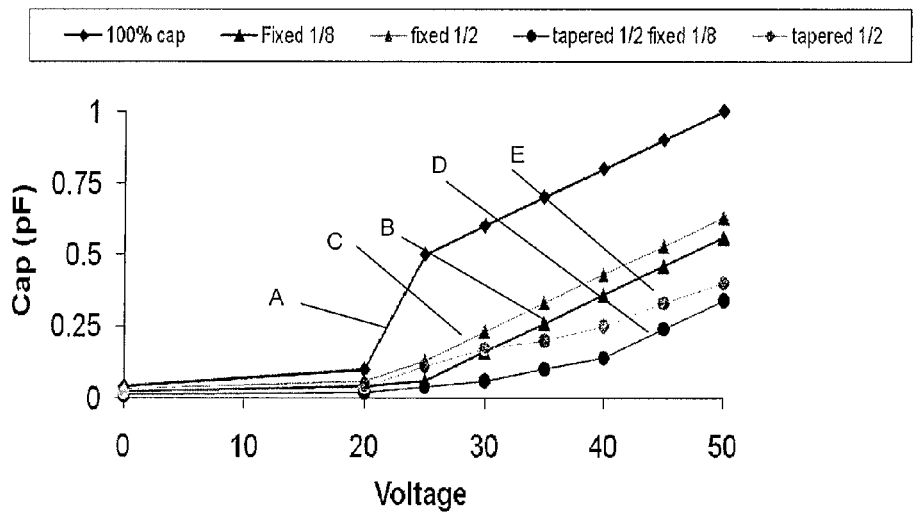
FIG. 12 shows a comparison graph of "snap down" effect of various MEMS beam designs of the present invention with actuator bumps vs. a conventional MEMS beam.

FIG. 12 shows a comparison graph of "snap down" effect of various MEMS beam designs with actuator bumps of the present invention vs. a conventional, non-reduced area MEMS beam. In FIG. 12, the x-axis is voltage and the "y" axis is capacitance (measured in pF). As shown in this graph, line "A" represents a conventional, non-reduced area MEMS beam (with no actuator bumps); whereas, lines "B"-"E" represent MEMS beams of the present invention with an array of actuator bumps of varying heights, e.g., MEMS beam with reduced areas. For example, line "B" represents a MEMS beam having a tapered end that begins at approximately ⅛ of the length of the beam (e.g., a MEMS beam design of FIG. 9a);

line "C" represents a MEMS beam having a reduced area that is approximately ½ of the length of the beam (e.g., a MEMS beam design of FIG. 9b);

line "D" represents a MEMS beam having a tapered end that begins approximately at ½ of the length of the beam with a further reduced area at ⅛ from the end of the beam (e.g., a MEMS beam design of FIG. 9c); and line "E" represents a MEMS beam having a tapered end that is approximately ½ of the length of the beam (e.g., a MEMS beam design of FIG. 9a).

As shown in the graph of FIG. 12, the conventional MEMS beam does not have a linear pull-in, upon the application of voltage. Instead, the conventional MEMS beam suffers from a snap down effect at about 20V. The conventional MEMS beam also has the highest capacitance, due to the increased overall surface area, compared to the MEMS beams represented in lines "B"-"E". In contrast, the MEMS beams represented by lines "B"-"E" show a linear response to voltage, starting at about 20V. This linear response is attributed to the reduced area portions of the MEMS beams, as described above. Also, as expected, in comparing the MEMS beams of FIG. 11 and FIG. 12, the MEMS beams of FIG. 12, with the actuator bumps, exhibit a lower capacitance.

Table 2 shows an actuated tuning range of the conventional MEMS beam (with a uniform cross section (no reduced area) and that of the MEMS beams configurations of the present invention. Again, in Table 2, the actuated tuning range of the conventional MEMS beam is 2.0. In contrast, each of the actuated tuning ranges of the MEMS beams of the present invention are higher than the conventional MEMS beam. In fact, tuning ranges of up to 10.5:1 are achievable by the present invention. This tuning range is more than triple that of conventional solid state varactors and five times that of a conventional MEMS beam. Also, advantageously, each of the MEMS beams of the present invention has tuning range above 3:1.

TABLE 2

| LAYOUT | ACTUATED TUNING RANGE |
| --- | --- |
| Conventional MEMS beam | 2.0 |
| MEMS beam represented at line "B" of FIG. 12 | 10.5 |
| MEMS beam represented at line "C" of FIG. 12 | 8.5 |
| MEMS beam represented at line "D" of FIG. 12 | 9.3 |
| MEMS beam represented at line "E" of FIG. 12 | 3.6 |

Figure 13:
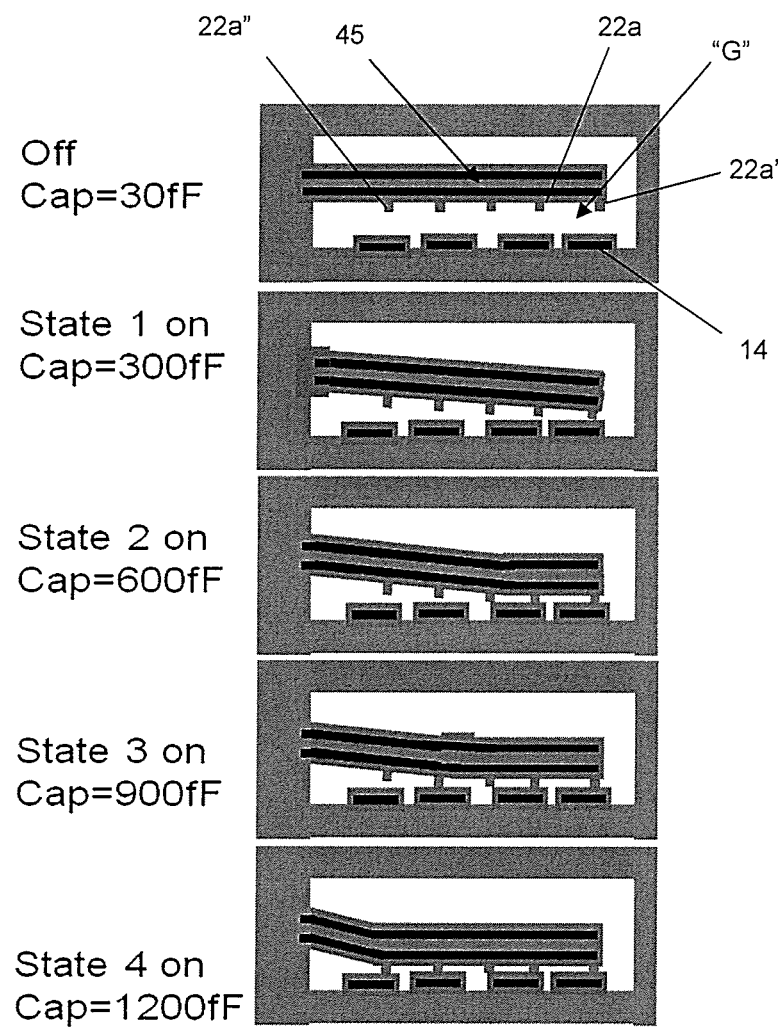
FIG. 13 shows a controlled actuation of a cantilever MEMS beam in accordance with the present invention.

FIG. 13 shows a controlled actuation of a cantilever MEMS beam in accordance with aspects of the present invention. More specifically, FIG. 13 shows a MEMS cantilever beam 45 with a reduced area and an array of bumpers 22a. In embodiments, the bumpers 22a can be fabricated from many different insulator materials depending on the desired capacitance and desired impact of the tuning range of the MEMS beam 45. For example, the insulator material can be a high-k dielectric (e.g., $HfO_2$) or a low-k dielectric (e.g., $SiO_2$). As should be understood by those of ordinary skill in the art, the higher-k dielectrics will provide a higher capacitance value.

It should be understood by those of skill in the art that the spacing of the bumpers 22a can vary depending on the stiffness of the MEMS beam 45. For example, the bumpers 22a can be provided closer together in a flexible beam than in a stiff beam. As the flexible beam has a higher probability of collapsing during the pull-in voltage, the closer spacing of the bumpers 22a will prevent such collapse and provide a more linear pull-in response. This is especially true after the MEMS beam 45 moves more than ⅓ the distance of the gap "G", at which time electrostatic charges overtake the pull-in force and, in typical structures, provide a non-linear response.

Also, the height of the bumpers 22a can be designed based on the stiffness of the MEMS beam 45, the pull-in voltage of the MEMS beam and/or the gap "G" between the MEMS beam 45 and the fixed electrode 14. In embodiments, for example, the gap "G" between the MEMS beam 45 and the fixed electrode 14 can be about 2 microns (or other heights of the removed sacrificial material), with the height of the bumpers 22a varying from about 1000 Å to about 500 Å. For example, the bumper 22a' at the end of the MEMS beam 45 can be about 1000 Å; whereas a height of the bumper 22a" (farthest away from the initial pull-in position) is about 500 Å; although other dimensions are also contemplated by the present invention. For example, the bumpers 22a can be of a uniform height.

As shown in FIG. 13, representatively, the bumpers 22a will ensure that there is a linear capacitance during the pull-in of the MEMS beam 45. For example, during actuation, the following capacitance values can be obtained:

in off state (non-actuated), the capacitance can be equal to about 30 fF;
in state 1, the capacitance can be equal to about 300 fF;
in state 2, the capacitance can be equal to about 600 fF;
in state 3, the capacitance can be equal to about 900 fF; and
in the fully actuated state, i.e., state 4, the capacitance can be equal to about 1200 fF.

In state 4, all of the bumpers 22a will be contacting the bottom electrode 14 (wire) or insulator layer provided on the bottom electrode 14. The bumpers 22a will also prevent stiction.

Figure 14:
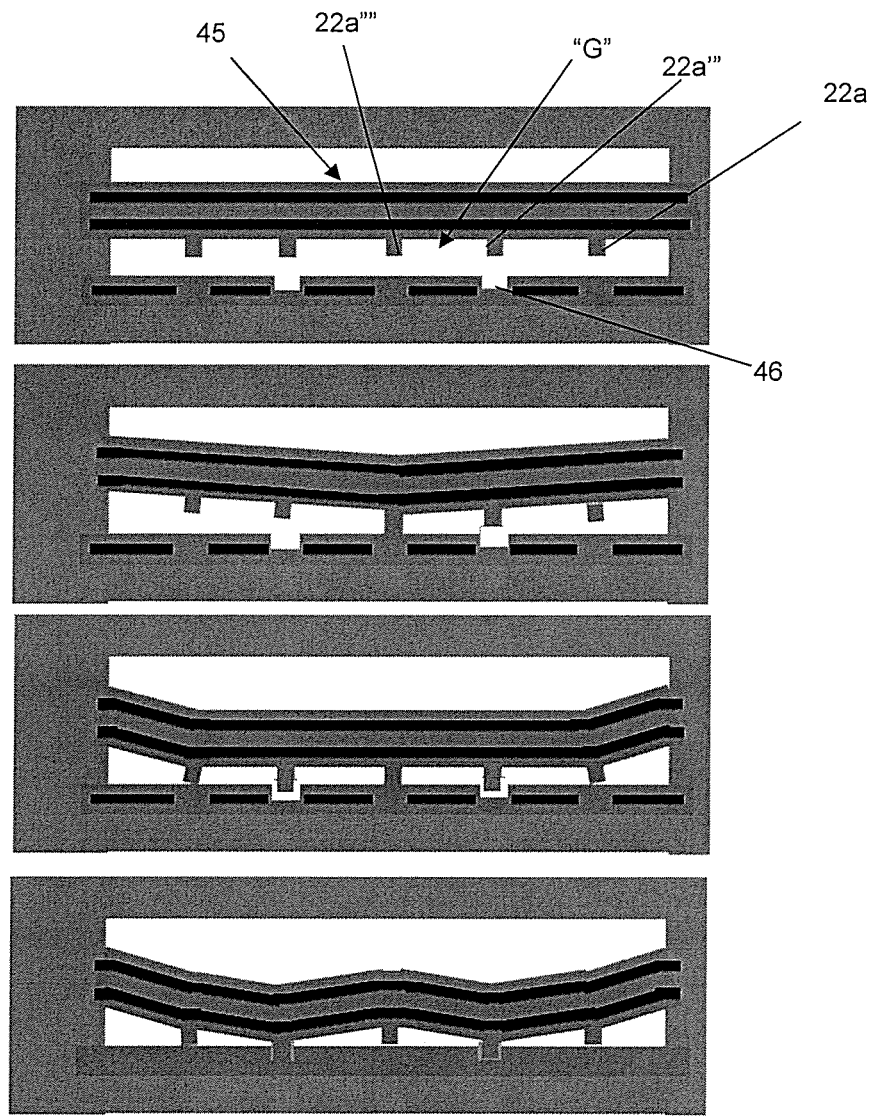
FIG. 14 shows a controlled actuation of a bridge MEMS beam in accordance with the present invention.

FIG. 14 shows a controlled actuation of a bridge MEMS beam in accordance with the present invention. More specifically, FIG. 14 shows a MEMS bridge beam 45' with a reduced area and an array of bumpers 22a. FIG. 14 also shows trenches 46 that are aligned with some of the bumpers 22a'. The trenches 46 are provided to control beam movement, particularly during the last 1000 Å thereof. More specifically, by using the combination of bumpers 22a''' and trenches 46, it is now possible to move the MEMS beam more slowly through a 0.2 micron range. In this way, it is now possible to utilize a small change in the gap "G" (e.g., between the MEMS beam and the fixed electrode) to provide a linear change in the capacitance, thereby providing a capacitance tuning. It should be understood by those of skill in the art that the trenches shown in FIG. 13 are equally applicable for a cantilever beam configuration shown in FIG. 12).

As with the cantilever MEMS beam, the bumpers 22a can be fabricated from many different insulator materials depending on the desired capacitance and desired impact of the tuning range of the MEMS beam 45'. For example, the insulator material can be a high-k dielectric (e.g., $HfO_2$) or a low-k dielectric (e.g., $SiO_2$).

It further should be understood by those of skill in the art that the spacing of the bumpers 22a can also vary depending on the stiffness of the MEMS beam 45. For example, the bumpers 22a can be provided closer together in a flexible beam than in a stiff beam, in order to prevent unwanted collapse of the MEMS beam 45'. Also, the height of the bumpers 22a can be designed based on the stiffness of the MEMS beam 45', the pull-in voltage of the MEMS beam and/or the gap "G" between the MEMS beam 45' and the fixed electrode 14. In embodiments, for example, the gap "G" between the MEMS beam 45' and the fixed electrode 14 can be about 2 microns (or other heights of the removed sacrificial material), with the height of the bumpers 22a varying from about 1000 Å to about 500 Å. For example, the bumper 22a" at a mid portion of the MEMS beam 45' can be about 1000 Å; whereas a height of the bumpers 22a at ends of the MEMS beam 45' can be about 500 Å; although other dimensions are also contemplated by the present invention. For example, the bumpers 22a can be of a uniform height.

Figure 15:
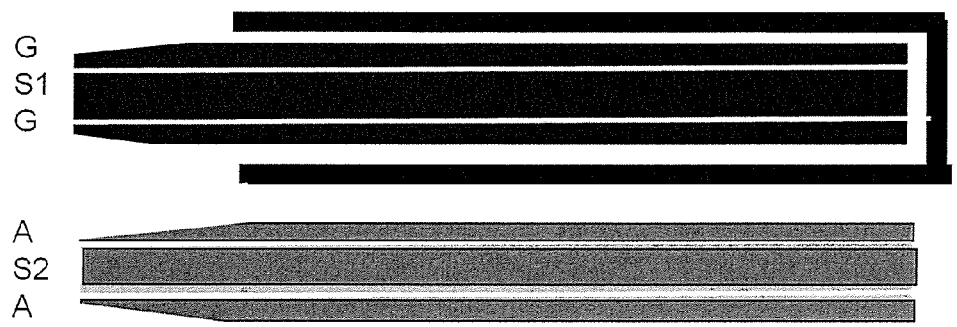
FIG. 15 shows a top view of a four electrode configuration in accordance with aspects of the present invention.

FIG. 15 shows a top view of a four electrode configuration of the present invention. As shown in this view, the ground electrodes (G) and the actuator electrodes (A) have a tapered configuration; whereas, the signal electrodes (S1 and S2) are of uniform cross section (width) and do not have any potential. Other reduced area configurations are also contemplated by the present invention, as discussed herein. As shown in this representation, the ground electrodes (G) and actuator electrodes (A) are decoupled from the signal electrodes (S1 and S2). In this way, the signals can be decoupled from the tuning voltage.

Figure 16:
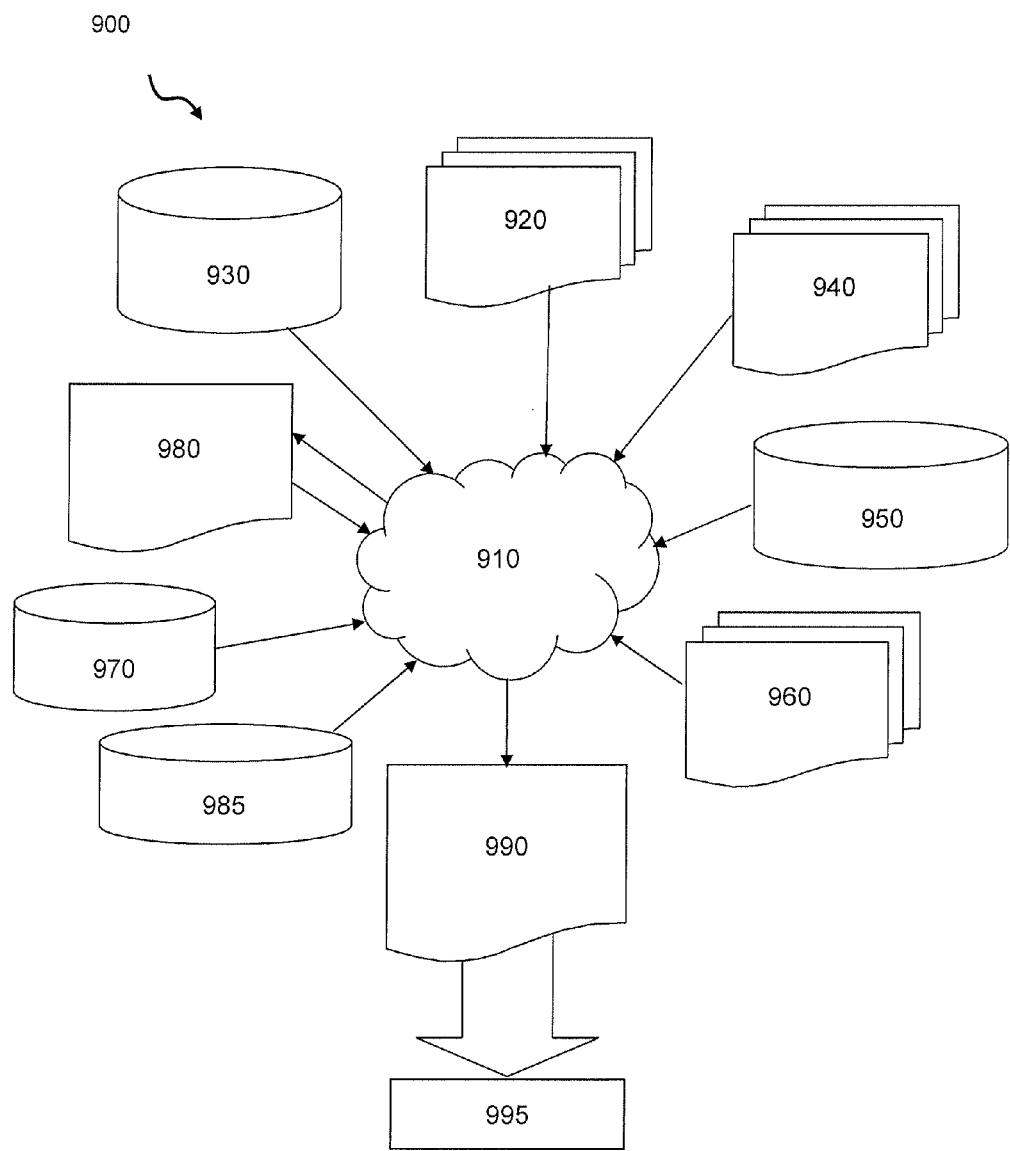
FIG. 16 is a flow diagram of a design process used in semiconductor design, manufacture, and/or test.

FIG. 16 is a flow diagram of a design process used in semiconductor design, manufacture, and/or test. FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7, 8a, 8b, 8c, 9a, 9b, 9c, 10 and 13-15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7, 8a, 8b, 8c, 9a, 9b, 9c, 10 and 13-15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7, 8a, 8b, 8c, 9a, 9b, 9c, 10 and 13-15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7, 8*a*, 8*b*, 8*c*, 9*a*, 9*b*, 9*c*, 10 and 13-15. In one embodiment, design structure 990 may comprise a compiled, executable HDL simulation model that functionally simulates the devices shown in FIGS. 1-7, 8*a*, 8*b*, 8*c*, 9*a*, 9*b*, 9*c*, 10 and 13-15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7, 8*a*, 8*b*, 8*c*, 9*a*, 9*b*, 9*c*, 10 and 13-15. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming at least one fixed electrode on a substrate; and
   forming a Micro-Electro-Mechanical System (MEMS) beam with a varying width dimension, as viewed from a top of the MEMS beam, over the at least one fixed electrode.

2. The method of claim 1, wherein forming the varying width dimension comprises:
   forming a first portion with a constant width and a second portion with a reduced area.

3. The method of claim 2, wherein the second portion is formed at an initial pull-in portion of the MEMS beam.

4. The method of claim 3, wherein the initial pull-in portion of the MEMS beam is formed as one of:
   a tapered end portion of a cantilever MEMS beam; and
   a tapered midsection portion of a bridge MEMS beam.

5. The method of claim 3, further comprising forming actuator bumps extending from a surface of the MEMS beam toward the at least one fixed electrode.

6. The method of claim 5, wherein the actuator bumps are of varying height, with a height of an actuator bump at the initial pull-in portion of the MEMS beam being larger than a height of an actuator bump at another portion of the MEMS beam.

7. The method of claim 5, further comprising forming at least one trench in a substrate and between two of the fixed electrodes and aligned with at least one of the actuator bumps remote from the initial pull-in portion of the MEMS beam.

8. The method of claim 3, wherein the initial pull-in portion is formed with a constant width which is smaller than the constant width of the first portion.

9. The method of claim 8, wherein the initial pull-in portion of the MEMS beam is formed as one of:
   an end portion of a cantilever MEMS beam; and
   a midsection portion of a bridge MEMS beam.

10. The method of claim 8, further comprising forming actuator bumps extending from a surface of the MEMS beam toward the at least one fixed actuator.

11. The method of claim 10, wherein the actuator bumps are of varying height, with a height of an actuator bump at the initial pull-in portion of the MEMS beam being larger than a height of an actuator bump at another portion of the MEMS beam.

12. The method of claim 10, further comprising forming at least one trench in a substrate and between two of the fixed electrodes and aligned with at least one of the actuator bumps remote from the initial pull-in portion of the MEMS beam.

13. The method of claim 1, wherein forming the varying width dimension comprises:
   forming a first portion with a constant width dimension;
   forming a second portion with a tapered width dimension; and
   forming a third portion with a constant width dimension which is smaller than the constant width dimension of the first portion,
   wherein third portion is formed at an initial pull-in portion of the MEMS beam.

14. The method of claim 13, wherein the initial pull-in portion of the MEMS beam is formed as one of:
   an end portion of a cantilever MEMS beam; and
   a midsection portion of a bridge MEMS beam.

15. The method of claim 13, further comprising forming actuator bumps extending from a surface of the MEMS beam toward the at least one fixed actuator, wherein the actuator bumps are of varying height, with a height of an actuator bump at the initial pull-in portion of the MEMS beam being larger than a height of an actuator bump at another portion of the MEMS beam.

16. The method of claim 15, further comprising forming at least one trench in a substrate and between two of the fixed electrodes and aligned with at least one of the actuator bumps remote from the initial pull-in portion of the MEMS beam.

17. A method of forming a MEMS varactor, comprising:
   forming a fixed electrode layer on a substrate through deposition and patterning;
   forming a sacrificial material over the fixed electrode;
   layering metal and insulator materials over the sacrificial material;
   masking the layered metal and insulator materials with a varying width dimension;

etching the layered metal and insulator materials to form a beam structure with a non-uniformed width dimension, the non-uniform width dimension includes a reduced area portion of an initial pull-in section of the beam; and forming a cavity about the beam through a venting process.

18. The method of claim 17, further comprising forming a plurality of actuator bumps comprising insulator material, extending from a surface of the beam and towards the fixed electrode layer and being of varying height.

19. The method of claim 18, further comprising forming at least one trench between two of the fixed electrodes and aligned with at least one of the plurality of actuator bumps.

20. The method of claim 17, further comprising forming a plurality of bumpers comprising insulator material, extending from a surface plane of the fixed electrode layer and towards the beam.

21. A method in a computer-aided design system for generating a functional design model of a MEMS structure, the method comprising:

generating a functional representation of a fixed electrodes formed on a substrate;

generating a functional representation of a composite beam structure having a varying width dimension with at least a first portion of a constant dimension and a second portion of a reduced width compared to the first portion, the second portion comprising an initial pull-in portion of the beam structure; and generating a functional representation of a cavity structure surrounding the beam structure.

* * * * *